United States Patent
Abbaspour et al.

(10) Patent No.: US 8,396,910 B2
(45) Date of Patent: Mar. 12, 2013

(54) EFFICIENT COMPRESSION AND HANDLING OF MODEL LIBRARY WAVEFORMS

(75) Inventors: Soroush Abbaspour, Ossining, NY (US); Peter Feldmann, New York, NY (US); Safar Hatami, Los Angeles, CA (US)

(73) Assignee: International Business Machines Corporation, Armonk, NY (US)

( * ) Notice: Subject to any disclaimer, the term of this patent is extended or adjusted under 35 U.S.C. 154(b) by 1158 days.

(21) Appl. No.: 12/265,765

(22) Filed: Nov. 6, 2008

(65) Prior Publication Data

US 2010/0115013 A1  May 6, 2010

(51) Int. Cl.
 *G06F 7/00* (2006.01)
(52) U.S. Cl. ...................................... 708/203
(58) Field of Classification Search ............... None
 See application file for complete search history.

(56) References Cited

U.S. PATENT DOCUMENTS

| | | | |
|---|---|---|---|
| 6,629,299 B1 | 9/2003 | Iwanishi | |
| 6,654,713 B1 | 11/2003 | Rethman et al. | |
| 7,010,482 B2 | 3/2006 | Gottesman et al. | |
| 7,110,547 B2 * | 9/2006 | Short | 380/263 |
| 7,215,776 B1 | 5/2007 | Short | |
| 7,408,499 B2 | 8/2008 | Szajnowski | |
| 7,421,379 B2 | 9/2008 | Levy | |
| 2003/0169940 A1 * | 9/2003 | Short | 382/249 |
| 2004/0254968 A1 | 12/2004 | Ferguson | |
| 2007/0053517 A1 * | 3/2007 | Short | 380/263 |
| 2007/0143719 A1 | 6/2007 | Chopra et al. | |
| 2007/0208791 A1 * | 9/2007 | Short | 708/203 |
| 2008/0078280 A1 | 4/2008 | Okazaki et al. | |
| 2010/0115013 A1 * | 5/2010 | Abbaspour et al. | 708/203 |

OTHER PUBLICATIONS

Feldmann et al.; Driver Waveform Computation for Timing Analysis with Multiple Voltage Threshold Driver Models; Proc. of Design Automation Conference; Anaheim, CA; Jun. 8-13, 2008; pp. 425-428.
Richard Trihy; Addressing Library Creation Challenges from Resent Liberty Extensions; Proc of Design Automation Conference; Anaheim, CA; Jun. 8-13, 2008; pp. 474-479.
Ramalingam et al.; Accurate Waveform Modelling using Singular Value Decomposition with Applications to Timing Analysis; Proc. of Design Automation Conference; San Diego, CA; Jun. 4-8, 2007; pp. 148-153.
V. Zolotov et al.; Compact Modeling of Variational Waveforms; Proc. of International Conference on Computer Aided Design; 2007; pp. 705-712.
Synopsys Product Information; .http://www.synopsys.com/products/solutions/galaxy/ccs/ccs_faq.html; Synopsys website; 2008; 2 pages.
Nangate Product Informaton; http://www.nangate.com/index.php?option=com_content&task=view&id=83&Itemid=102; Nangate website; 2008; 2 pages.

* cited by examiner

*Primary Examiner* — David H Malzahn
(74) *Attorney, Agent, or Firm* — Tutunjian and Bitteto, P.C.; Preston Young (57) ABSTRACT

A system and method for waveform compression includes preprocessing a collection of waveforms representing cell and/or interconnect response waveforms and constructing a representative waveform basis using linear algebra to create basis waveforms for a larger set of waveforms. The collection waveforms are represented as linear combination coefficients of an adaptive subset of the basis waveforms to compress an amount of stored information needed to reproduce the collection of waveforms. The representation of coefficients may be further compressed by, e.g., analytic representation.

25 Claims, 10 Drawing Sheets

EFFICIENT COMPRESSION AND HANDLING OF MODEL LIBRARY WAVEFORMS

BACKGROUND

1. Technical Field

The present invention relates to data storage and more particularly to systems and methods for efficient storage of waveform libraries.

2. Description of the Related Art

Traditional, delay and slew based, library cell modeling methodology is no longer accepted as accurate for the new nanometer-era CMOS technologies. Recently, the industry is in the process of adopting a more detailed Current Source Modeling (CSM) as an alternative. Effective Current Source Model (ECSM) (initially developed by Cadence Design Systems™ and adopted by SI2 Open Modeling Coalition), and Composite Current Source Model (CCS) (proposed by Synopsys™) are extensions of the Liberty library format and contain separate models for timing, noise, and power applications.

The new CSM modeling paradigm combined with technology trends requires significantly more memory resources compared to traditional techniques. CSM modeling requires the storage of tables of current or voltage waveforms in addition to just the delay and slew quantities. Additionally, the increased parameter variability inherent in modern VLSI technologies, forces the timing analysis to rely on library characterizations of even more points in the temperature, voltage and process space, thus further compounding the library size problem. In addition, the noise and power verification tools are also in the process of converting to waveform-based models, causing a further explosion of the library modeling data.

Library characterization tools already attempt waveform compression in various ways, e.g., Nangate public library stores waveforms with a minimal number of points, but on a non-uniform voltage grid. This effectively doubles the information that needs to be stored. Synopsys Liberty NCX™ uses an empirical waveform compression scheme that takes into account key features of the current versus time waveforms. As such, their method is very specific to their particular modeling methodology. For statistical timing analysis purposes, a compact variational waveform model is represented by storing the nominal waveform and its perturbations (e.g. time shifting, time scaling, voltage shifting, and voltage scaling). However, the nominal waveform, itself, is not stored in a compact form, therefore, requiring large memory resources during timing analysis.

In one existing system, voltage waveforms of gates are modeled as a linear combination of a fixed set of basis waveforms chosen by singular value decomposition (SVD). However, this approach may result in non-casual waveforms for some complex gates especially in the CMOS library which contains transmission-gates.

SUMMARY

A system and method for waveform compression includes preprocessing a collection of waveforms representing cell responses. An orthogonal temporal waveform basis is constructed using singular value decomposition to create basis waveforms. The collection of waveforms is represented as linear combination coefficients of a fixed or an adaptive subset of the basis waveforms to compress an amount of stored information needed to reproduce the collection of waveforms.

Another system and method for waveform compression include preprocessing a collection of waveforms representing cell and/or interconnect response waveforms and constructing a representative waveform basis using linear algebra to create basis waveforms for a larger set of waveforms. The collection waveforms are represented as linear combination coefficients of an adaptive subset of the basis waveforms to compress an amount of stored information needed to reproduce the collection of waveforms.

In another embodiment, the coefficients chosen to represent the waveform exhibit a smooth dependence on variables of interest such as load capacitance, input slew, temperature, etc., and therefore are parameterized using simple analytic functions. Besides significantly increasing the compression ratio, another benefit of parameterization is to provide the necessary interpolated CSM waveforms at points not stored in the model tables as needed by timing algorithms.

A system for compressing waveforms includes a preprocessor configured to preprocess a collection of waveforms representing cell response waveforms, and a principal component analysis (PCA) module configured to construct a representative waveform basis using linear algebra to create basis waveforms for a larger set of waveforms. A compression module is configured to compress the collection waveforms by representing the collection of waveforms as linear combination coefficients of an adaptive subset of the basis waveforms to reduce an amount of stored information needed to reproduce the collection of waveforms.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, systems and methods for efficient storage of waveforms and waveform libraries are provided. The employed method represents each library waveform using a variable number of basis waveforms, their number being determined by the desired accuracy. For example, 2-3 basis waveforms will be sufficient to represent the majority of the library waveform set, while a much smaller set of difficult library waveforms would need up to 14 basis waveforms. Adaptive compression is also used to retain causality properties of each library waveform by increasing the number of basis waveforms until both the required accuracy and causality is attained. This adaptive method results in a lower average number of basis waveforms necessary to represent each of the waveforms in the library, thus resulting in higher compression ratios than a fixed set representation.

The compression introduced in accordance with the present embodiments is based on rigorous and general theory. The compression is, by certain measures, optimal and can be extended to all library formats. The present methods include constructing a basis of orthogonal waveforms from the largest available collection of the waveforms stored in the library. Adaptive compression is achieved by representing each waveform in the library as a linear combination of a variable number of basis waveforms. Therefore, only a few coefficients need to be stored for each waveform from which the waveform can be reconstructed with the needed accuracy. The generation of the basis includes a carefully tuned procedure including normalization, scaling, weighting, shifting, and performing singular value decomposition (SVD) on the entire collection of waveform data. The procedure is accurate and efficient and can accommodate large waveform collections, as the computational complexity increases almost linearly with the number of waveforms. Note that the causality, monotonicity, and other desirable properties of the library waveforms is guaranteed to be preserved during the compression procedures.

In addition, the coefficients chosen to represent the waveform exhibit a smooth dependence on variables of interest such as load capacitance, input slew, temperature, etc., and therefore can be parameterized using simple analytic functions. Besides significantly increasing the compression ratio, another benefit of parameterization is to provide the necessary interpolated CSM waveforms at points not stored in the model tables as needed by timing algorithms.

The effectiveness of the present methods are demonstrated by compressing different real, industrial, CSM libraries. The achieved compression is from 75% to over 95% depending on the needed accuracy.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1A:
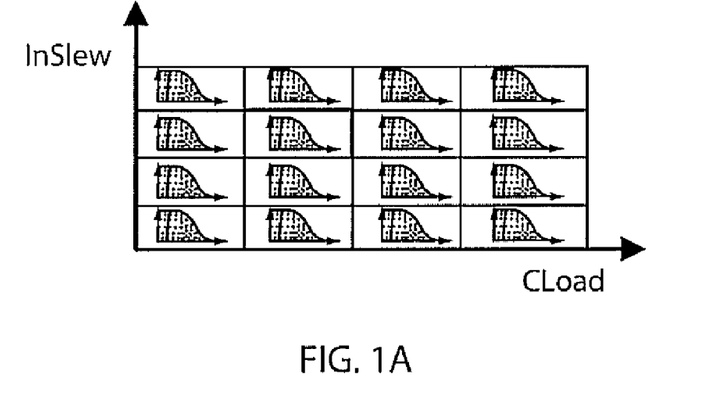
FIG. 1A is a diagram showing an ECSM voltage waveform table in accordance with an illustrative example.

Referring now in detail to the figures, like numerals represent the same or similar elements. Library cells are pre-characterized in the following way: Circuit-level simulations are performed on CMOS gates, excited with voltage ramps with a range of slew values and loaded by a range of pure capacitance values. CSM library standards differ by the forms in which they store the simulation results. ECSM based characterization uses tables of cell voltage response tables. The characterization data is stored as tables of time-voltage waveforms (represented by time delays at which cell outputs cross a set of pre-defined voltage thresholds) for each combination of input slew and load capacitance, as shown in FIG. 1A.

Figure 1B:
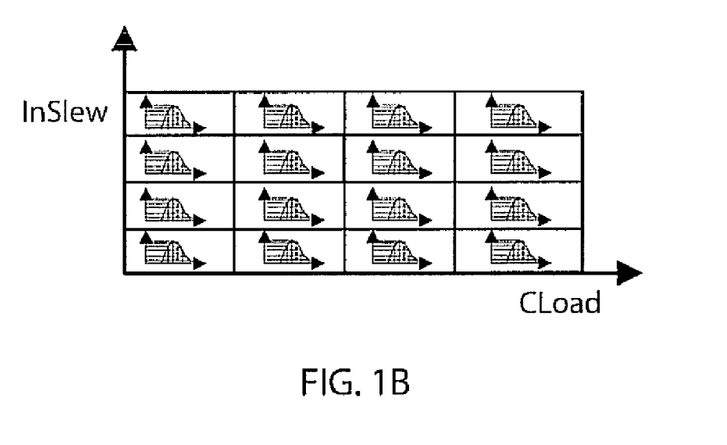
FIG. 1B is a diagram showing a CCS current waveform table in accordance with an illustrative example.

CCS uses a similar characterization style; the main difference is that the characterization data is stored as tables of current (rather than voltage) as a function of time, as depicted in FIG. 1B. The two raw characterization data sets are essentially equivalent and can be mapped from one to another.

The storage of entire waveforms in the CSM methodology as opposed to just selected features (e.g., delay and slew) in traditional techniques represents an order-of-magnitude increase of the characterization data volume and calls for data compression, even at the cost of some accuracy. In accordance with the present principles, we adopt a method for data compression based on Principal Component Analysis (PCA). The essence of PCA is the representation of the given data in a new coordinate system using a linear transformation. In the new system, the subspace of high-information-content data is easily distinguished from the subspace of low-information-content or redundant data.

PCA is mathematically defined as an orthogonal linear transformation that transforms the data to a new coordinate system such that the greatest variance by any projection of the data comes to lie on the first coordinate (called the first principal component), the second greatest variance on the second coordinate, and so on. PCA can be used for dimensionality reduction in a data set by retaining those characteristics of the data that contribute most to its variance. Compression is achieved by keeping lower-order principal components and ignoring higher-order ones. The low-order components include the "most important" aspects of the data. PCA is theoretically the optimum transform for fitting a given data set in the least square error sense ($L^2$ norm). It is also efficiently computed using a Singular Value Decomposition (SVD) algorithm.

CSM Waveform Compression will be described in accordance with the present principles. Two illustrative methods are provided for library compression, constant-ratio compression and adaptive compression. The constant-ratio method uses projection in the same subspace for all waveforms, whereas the adaptive method tries to maintain the same error threshold for all compressed waveforms by using a different projection for each waveform. The efficiency of the PCA-based compression is greatly improved by a pre-processing procedure, which focuses the method toward retaining the features essential to timing analysis. We also highlight a timing interpretation associated with the first few principal components.

Waveform Preprocessing: The compression methods include a well crafted and effective preprocessing step during which all waveforms that are used for basis extraction will be "normalized" by a procedure described below. Orthogonal basis extraction will be subsequently performed on the normalized waveforms. We start with a database of time vectors representing the monotonic CSM time-vs-voltage waveforms for various cells in the library:

$$T = [t_1, t_2, \ldots, t_d] \quad (1)$$

Here $t_k$, k=1, ... d, represents the time instances at which the output waveform crosses a given voltage threshold $V_k$. The voltages are all assumed to be normalized to the 0-1V interval and the thresholds are expressed as percentages. First, all waveforms are subjected to an affine transformation (shift and scale) which aligns all crossings of the, e.g., 10% threshold at time 0 and the, e.g., 90% crossing at time 1. Note that the threshold values are technology, library, and design methodology dependent and specified by the cell designers during characterization.

This scaling scheme has two advantages. First, since all the time values corresponding to the 10% and 90% thresholds are mapped onto the same set of values, the rank of database decreases by 2, which reduces the dimensionality and complexity of the original database, thereby, increasing its compressibility. Second, the 10% and 90% points are reconstructed more accurately, which is desirable for timing analysis.

Figure 2:
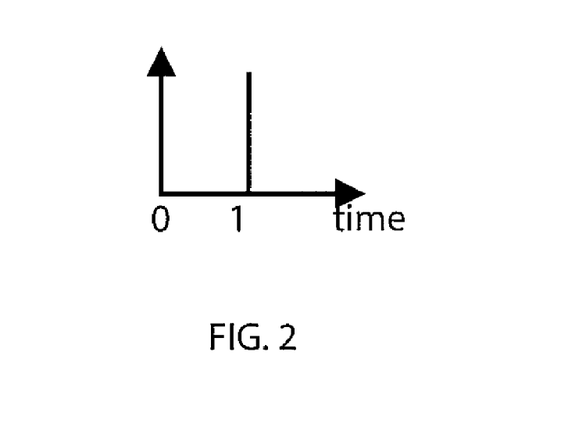
FIG. 2 is a diagram showing a $0^{th}$ basis vector in accordance with an illustrative example.

The next pre-processing step is averaging. In the present application, each CSM waveform time vector is a data vector and time points $t_1$ to $t_d$ are variables. The chosen averaging operation centers entries of the database in the direction of each time vector (data-wise) not in the direction of variables (time-wise). This kind of averaging has the advantage of introducing a new (low cost) basis vector (called the $0^{th}$ basis and graphically shown in FIG. 2), which is orthogonal to other basis vectors extracted by PCA. For most timing methods, only the difference between adjacent time points is needed, therefore, the coefficient associated with this basis vector may not even need to be stored.

Moreover, by centering time vectors around zero, the scaling and the subsequent weighting can be done symmetrically on the extremes of waveforms. The pre-processing procedure addresses the fact that not all portions of the waveform are equally relevant for the analysis. For example, given the properties of CMOS circuits, the exact behavior of the waveform under the 10% and over the 90% thresholds are less important for timing analysis. Therefore, ideally, the error introduced by compression should be distributed according to the accuracy needs of the timing method.

In the present procedure, we address this problem by differently weighting the various points in the original database, prior to the PCA step. We use small weights for the extreme points of waveforms in which we are less interested and larger weights for the intermediate points which are more significant for timing analysis. Ideally, weighting and the PCA analysis should be performed in tandem. Nevertheless, simulation results indicate that the present method is sufficiently accurate for waveform compression.

Figure 3A:
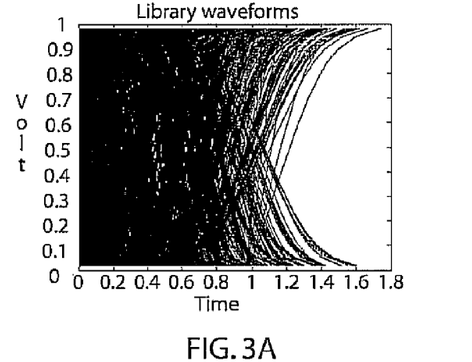
FIGS. 3A-3D are plots demonstrating preprocessing steps respectively including initial waveforms, scaled waveforms, averaged waveforms and weighted waveforms in accordance with one illustrative embodiment.
Figure 3B:
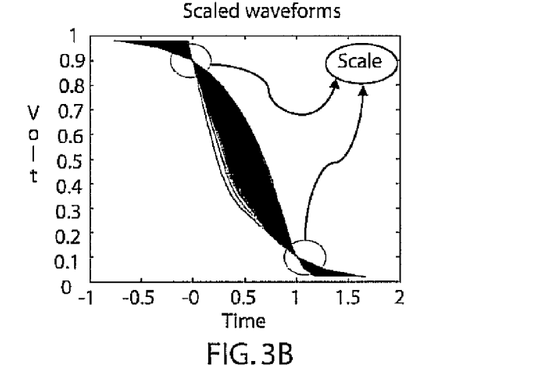
Figure 3C:
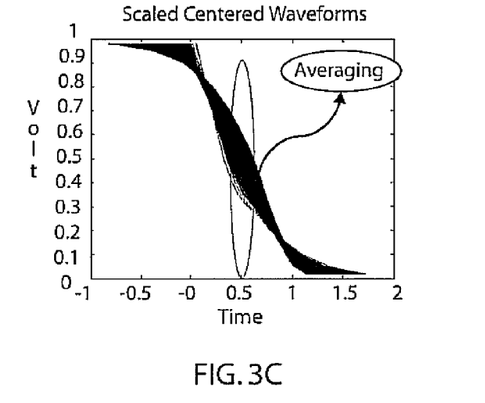
Figure 3D:
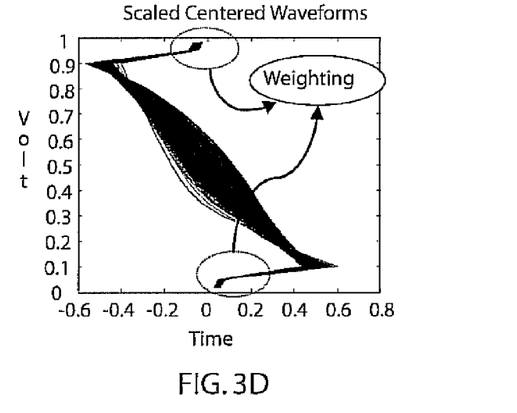

Referring to FIGS. 3A-3D, the preprocessing procedure is described graphically. In FIG. 3A, 1,715 waveforms are illustratively shown in a library of waveforms. In FIG. 3B, aligned waveforms are scaled, e.g., on 10% and 90%. In FIG. 3C, waveforms are averaged. In FIG. 3D, the waveforms are weighted. Functions and methods for performing the preprocessing will depend on the waveforms being processed and the needs of the application.

Generation of the Basis Vectors: We assume that the original database is organized as a matrix, A, each row representing a preprocessed waveform as represented by Eq. 2. For a typical library there will be hundreds of thousands of rows. Principal component analysis (PCA) computes a new basis for representing the waveforms through the SVD algorithm. The SVD algorithm applied to matrix A yields the decomposition.

$$A = U \Sigma V' \quad (2)$$

Here $\Sigma$ is a diagonal matrix of singular values in decreasing order and the rows of V represent an orthogonal basis of waveforms: the principal components. By setting the "small" singular values to zero, we obtain a low rank approximation of the original matrix, i.e., a representation in terms of a subset of basis vectors which is optimal in the sense of minimizing the "average" error. This provides a transformation from one coordinate system to another.

Constant ratio compression: The constant-ratio compression method will now be described. In this method, the number of coefficients for every compressed waveform is the same. The benefit of this method is its simplicity. However, this method needs to be accompanied with a causality enforcing procedure. By causality, we mean the requirement that the crossing times $t_k$, k=1, ..., d are monotonically increasing, an obvious property for time-voltage waveforms, which is not necessarily preserved by the approximation.

Figure 4:
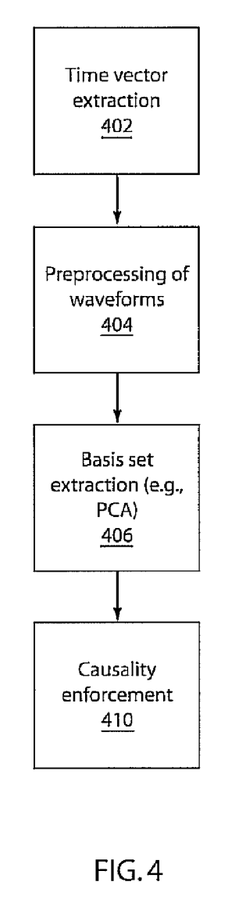
FIG. 4 is a block/flow diagram showing a system/method for employing a constant ratio compression technique in accordance with one illustrative embodiment.

Referring to FIG. 4, to model each time vector with m principal coefficients, the constant-ratio compression method works as follows. In block 402, the waveforms from the database are extracted in the form of time-crossing vectors for each waveform $t_k$, k=1, . . . , d and arranged as rows of a matrix. In block 404, the matrix is preprocessed by shifting and scaling each waveform to align all 10% and 90% crossing times, subtracting the row averages, and weighting in order to de-emphasize the extremes of the waveforms (see FIGS. 3A-3D). In block 406, basis set extraction is performed by running the SVD algorithm on the resulting matrix. In block 408, coefficient calculation is performed by fixed projection into the m first basis vectors corresponding to the largest singular values. In block 410, causality enforcement is performed.

The non-causality problem is a significant issue when the libraries with more complex gates are compressed. The following procedure is provided in conjunction with the constant ratio compression method to cope with the non-causality.

Figure 5:
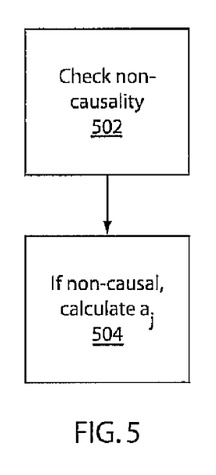
FIG. 5 is a block/flow diagram showing a system/method for causality enforcement in accordance with one illustrative embodiment.

Referring to FIG. 5, the method to cope with the non-causality includes the following. In block 502, check non-causality for every reconstructed time vector $$T_r = \sum_{j=0}^{m} a_j P_j,$$

where $a_j$ and $P_j$ denote principal coefficients and components, respectively. This is done by verifying that $t_k$, k=1, . . . , d is monotonically increasing. In block 504, if $T_r$ is non-casual, solve min$\|T-T_r\|$=calculate $a_j$,for j=0, . . . ,m s.t.$(t_i)_r < (t_{i+1})_r$ for i=1, . . . ,m It is clear that the calculated $a_j$ from the above method is not optimal in terms of the $L^2$ norm criteria. Therefore, the procedure may result in inaccurate compression. The adaptive compression method herein below results in high compression ratio for the same accuracy level while maintaining the causality condition.

Figure 6A:
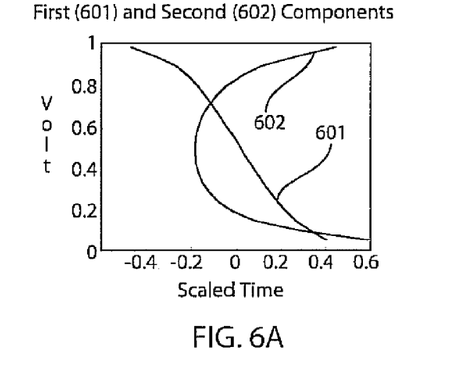
FIGS. 6A and 6B are plots illustratively showing first and second basis vectors (FIG. 6A) and third and fourth basis vectors (FIG. 6B)
Figure 6B:
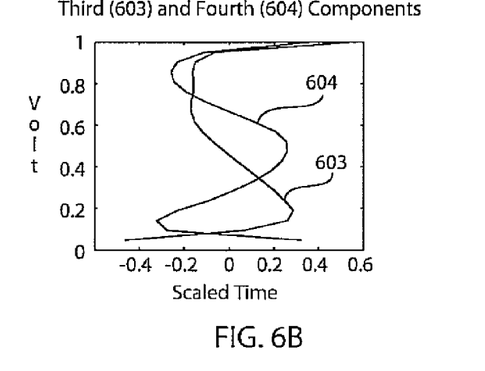

Referring to FIGS. 6A and 6B, examples of basis waveforms for real libraries are shown. FIG. 6A shows first 601 and second 602 basis vectors, while in FIG. 6B, third 603 and fourth 604 basis vectors are shown. FIGS. 6A and 6B show why arbitrary linear combinations of these waveforms do not guarantee causality in general. Nevertheless, the dominant basis vectors reflect the true physical properties of the waveforms.

Adaptive Compression: An adaptive compression technique achieves superior compression ratios and simultaneously solves the causality enforcement problem. This method adaptively chooses a number of coefficients for each waveform while meeting a specific required accuracy. The adaptive compression method is capable of checking non-causality during the coefficient selection and guarantees a causal reconstructed waveform.

Figure 7:
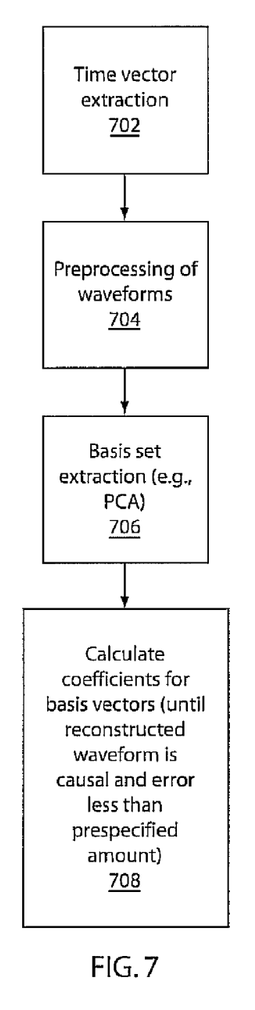
FIG. 7 is a block/flow diagram showing a system/method for adaptive compression in accordance with one illustrative embodiment.

Referring to FIG. 7, to compress each waveform with a maximum error $\epsilon_0$, the adaptive compression method is composed of the following steps. In block 702, time vector extraction from the library is performed similar to block 402. In block 704, preprocessing is done as described in block 404 (FIGS. 3A-3D). In block 706, basis set extraction is performed as described in block 406. In block 708, coefficient calculations for each waveform are performed by selecting a sufficient number of basis vectors to satisfy accuracy (e.g. pre-specified error $\epsilon_0$) and causality constraints, and calculating the coefficients corresponding to each selected basis vector.

Parameterization: An additional parametric compression method uses the principal coefficients obtained by the procedure in FIGS. 4 and 7. Parametric compression, besides increasing the compression ratio, also provides waveform interpolation, e.g., it calculates the waveforms corresponding to input slews and load capacitances between the points provided in a model table.

Parametric compression represents the coefficients calculated by PCA as approximate analytic functions of input slews (S), load capacitances (C), and Process, Supply Voltage, Temperature, (PVT) variables, $a_i=f_i(C, S, V_{PVT})$, where $V_{PVT}$ is the vector of all PVT variables. This form is significantly more compact than the tabular storage of PCA coefficients. Parameterization is useful even in the one dimensional case. For example, ECSM analysis uses waveforms (time and voltage) corresponding to a continuous range of load capacitances.

Figure 8A:
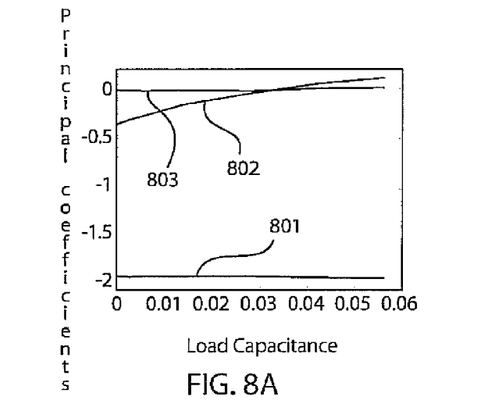
FIGS. 8A and 8B are plots showing first, second and third coefficients for two different gates in accordance with an illustrative embodiment.
Figure 8B:
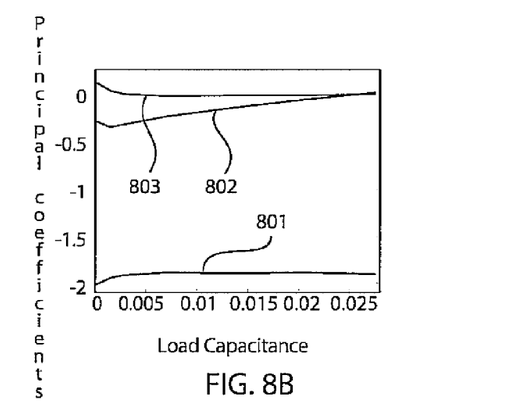

Referring to FIGS. 8A and 8B, first 801, second 802 and third 803 coefficients ($k_i$) versus load capacitance for two different gates are illustratively depicted.

Simulation shows that principal coefficients have a near-linear dependence on load capacitances. Based on this observation, a linear model for principal coefficients includes: $a_i=f_i(C)=k_1+k_2C$. We also report the simulation results for a second order polynomial model $a_i=f_i(C)=k_1+k_2C+k_3C^2$. As mentioned above, parameterization permits higher compression and enables interpolation.

Figure 9:
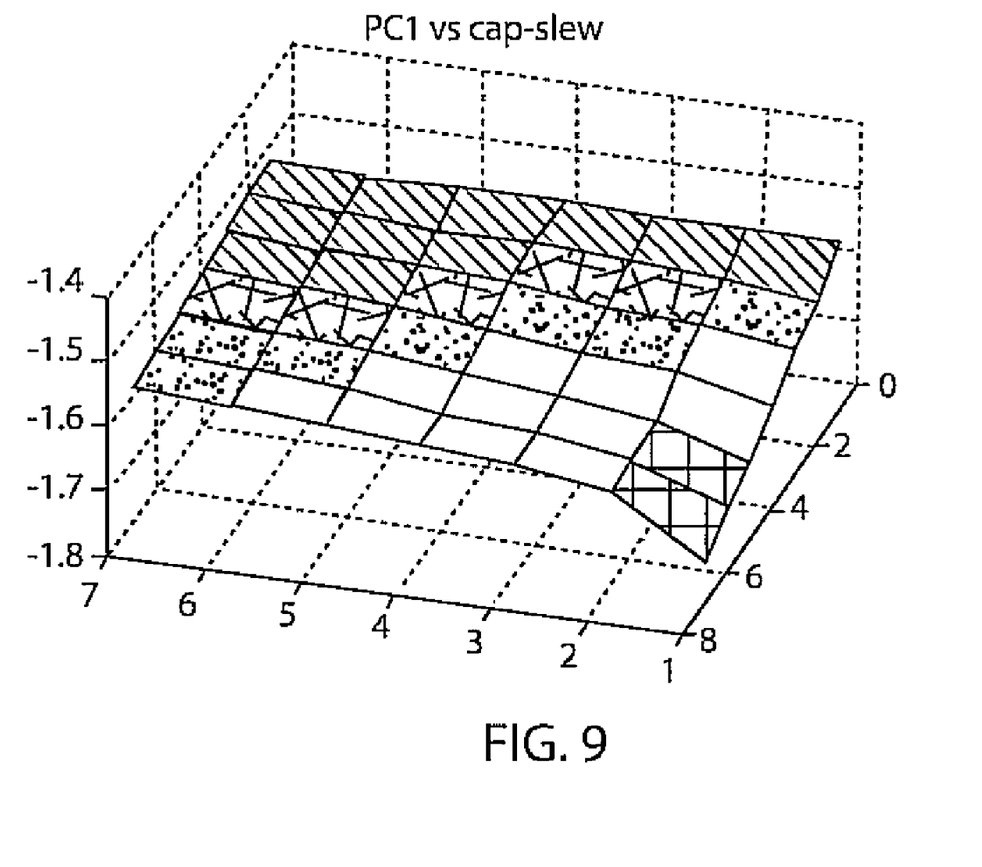
FIG. 9 is a diagram showing a first coefficient in a slew-capacitance plane.

A more general parametric compression is to express principal coefficients in terms of input slew and load capacitance and even PVT variables. FIG. 9 shows a first component versus input slew and load capacitance for a gate. Here, we present a bilinear and second order polynomial to present principal coefficients in terms of load capacitance and input slew. It becomes possible to extend the parametric representation to the complete PVT space. Equations (3) and (4) describe bilinear and second order parameterization respectively:

$$a_i = f_i(C, S) = k_1 + k_2C + k_3S + k_4C*S \quad (3)$$

$$a_i = f_i(C, S) = \sum_{\substack{m,n=0 \\ m+n \leq 2}}^{2} k_{mn} C^m S^n \quad (4)$$

Simulation results show that a bilinear representation has an acceptable accuracy for the ECSM timing analysis. Alternatively, coefficients can also be modeled by a two dimensional piecewise linear surface in the slew-capacitance (S-C) plane as shown by the accuracy versus compaction tradeoff in the results below.

Experimental Results: Simulation results for non-parametric and parametric compression techniques applied to the ECSM and CCS libraries is provided. Time, voltage and current units are nanosecond, volt and micro Amperes, respectively.

Constant-Ratio Compression: To verify the accuracy and efficiency of the present techniques, the experiments are, first, carried out on a sample 65 nm ECSM library with 35 CMOS gates, characterized at nominal process corner, 0.925 volt, and 125° C. Each gate is characterized for 7×7 (input slew, output capacitive load) combinations and for each of these combinations, a voltage waveform with 21 uniform voltage point increment ({0%, 0.05%, 0.10%, . . . , 0.95%, 100%} of $V_{DD}$) is stored in the ECSM library which are shown in FIG. 3A. The previously described pre-processing steps (shifting, scaling, averaging, weighting), described in FIGS. 3B-3D, are performed on the ECSM library. Note that the shifted and scaled waveforms cross at the 10% and 90% $V_{DD}$ transition times to maintain the accuracy level at 10% and 90% transition times of compressed waveforms.

FIG. 3C presents the waveforms centered on the origin by using the averaging operation. Next, the first two and last two points of the voltage waveforms are weighted by 0.05 and 0.1, respectively, as illustrated in FIG. 3D.

Table 1 summarizes the results for compression ratios as well as the compression error using different error probing criteria.

TABLE 1

Error measurement criteria for 82% library compression:

| Exp | Description | Max Error | Type of Error Measurement |
|---|---|---|---|
| 1 | Weighted extremes points | 0.3 ps | Absolute $L^2$ norm |
|   |   | 1.4% | Relative $L^2$ norm |
|   |   | 2% | Relative on 10%-90% |
|   |   | 1.6% | Relative on 50% delay |
| 2 | Un-weighted | 0.64 ps | Absolute $L^2$ norm |
| 3 | Weighted 50% point | 0.5% | Relative on 50% delay |
| 4 | Weighted extreme points and rising/falling classification | 0.12% | Relative $L^2$ norm |

Figure 10A:
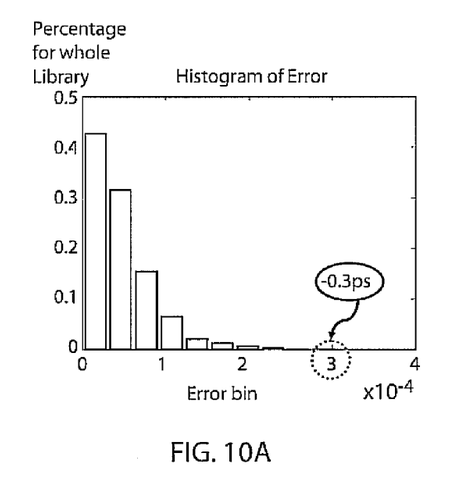
FIG. 10A shows a histogram of absolute error for 1,715 waveforms.
Figure 10B:
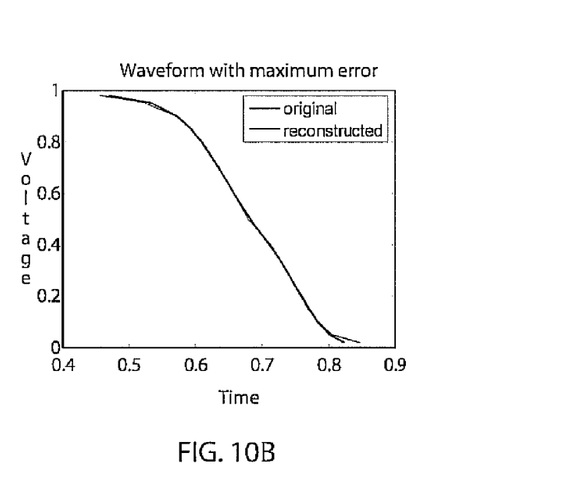
FIG. 10B shows the waveform of the 1,715 waveforms in FIG. 10A with maximum error.

FIG. 10A shows the absolute error of compressed waveforms (on the waveform of FIG. 3D) using the first four coefficients (82% library compression). The maximum $L^2$-norm absolute error is 0.3 ps for the waveform shown in FIG. 10B. The histogram in FIG. 10A also shows that, in most cases, using the first four coefficients, the $L^2$-Norm absolute error diminishes exponentially, which confirms that adaptive compression technique is a better solution to achieve higher compression ratios.

Other error measurement criteria have also been used to evaluate the quality of the proposed techniques as shown in Table 1. Experiment 1 presents the maximum relative/absolute $L^2$-norm error between the original ECSM voltage waveforms and the weighted compressed ones. As seen in this table, the compression with four coefficients yields sufficient accuracy levels with different error criteria. On the other hand, the experimental results show that if the compression is done without the weighting preprocessing step, the compression error for the points between 10% to 90% transition times can be doubled (experiment 2 in Table 1).

For experiment 3 in Table 1, 50% transition time is emphasized during compression. This experiment shows a 3-fold reduction in compression error compared to un-weighted compression strategy. Experiment 4 in Table 1 confirms that raising and falling transitions can be efficiently compressed using a common basis. The maximum errors for compressing separately falling and rising waveforms are 0.12 ps and 0.2 ps, respectively, only slightly better than the maximum error of 0.3 ps for uncategorized voltage waveforms.

The next experiment, tested the viability of using the basis set extracted from one process-voltage-temperature (PVT) corner to model (compress) the CSM library waveforms for another PVT corner. For this experiment, 8 2891-waveform libraries at 8 different PVT points were employed and the basis set extracted from one corner library is utilized to model the waveforms of the other seven CSM libraries). The maximum error was 1 ps.

Figure 11A:
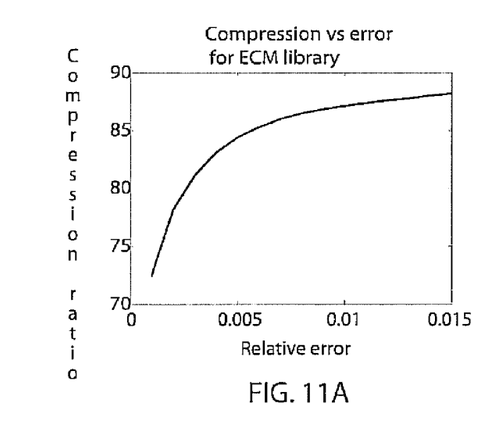
FIG. 11A is a plot of error versus compression for adaptive compression.
Figure 11B:
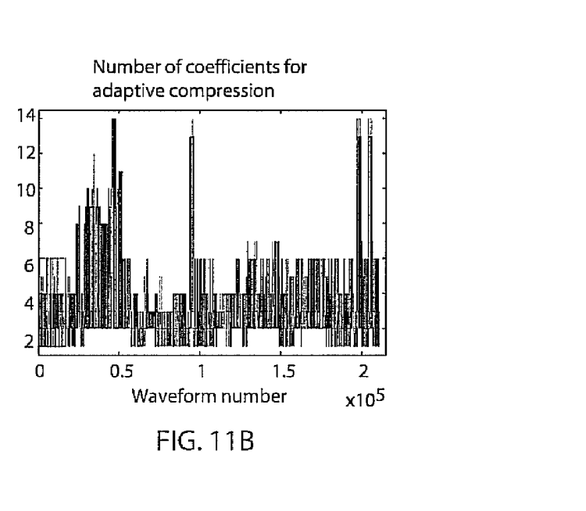
FIG. 11B is a plot of the number of coefficients for 88% compression.

Adaptive Compression: We applied the adaptive compression algorithm to a 65 nm ECSM library with 754 gates and 210,798 waveforms. This library includes a wide range of gates including flip-flop, XOR, XNOR, Multiplexer, etc. FIG. 11A shows the compression ratio when the error adaptively changes from 1.5% to 0.01%. FIG. 11B shows the number of coefficients for each waveform. It has been observed that some voltage waveforms can be modeled with one or two coefficients while some voltage waveforms need a larger set of coefficients to be modeled accurately (14 out of 21). The latter waveforms belong to gates with transmission gates such as XOR, XNOR, and Multiplexer. Adaptive compression results in 88% compression with maximum relative $L^2$-norm error of 1.5%.

Figure 12A:
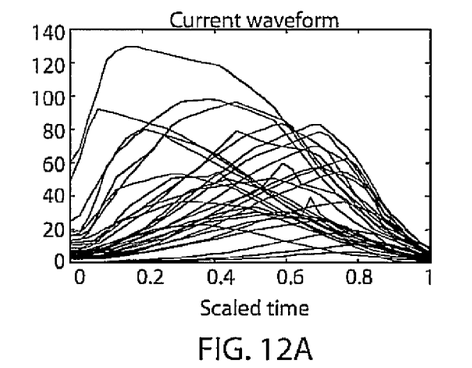
FIG. 12A is a plot of illustrative current waveforms.
Figure 12B:
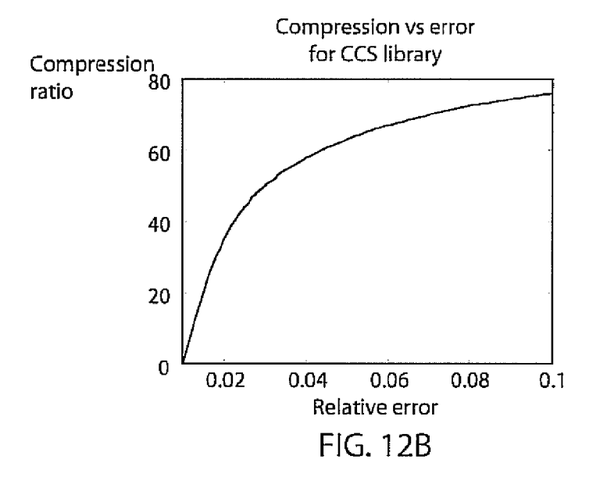
FIG. 12B is a plot of relative error versus compression.
Figure 12C:
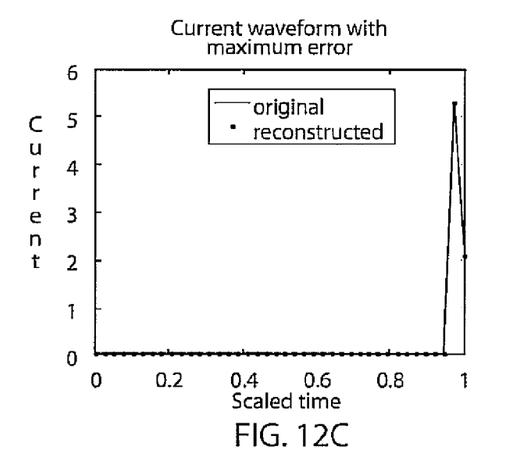
FIG. 12C is a plot of a waveform with maximum relative error of 10%.

CCS Library Compression: The simulation results for CCS waveform compression are reported. The Nangate CCS public library which has 71,616 current waveforms has been used for this experiment. FIG. 12A demonstrates a few CCS current waveforms. The preprocessing includes scaling in time and current. FIG. 12B shows adaptive compression ratio versus relative error. For a relative error of 10%, the adaptive compression ratio is 76%. The reconstructed waveform with maximum error is shown in FIG. 12C, which demonstrates the accuracy of waveform reconstruction.

Parameterization: The parametric compression for slew and capacitance is shown. The 65 nm ECSM library with 1,715 voltage waveforms is utilized for simulation.

Figure 13A:
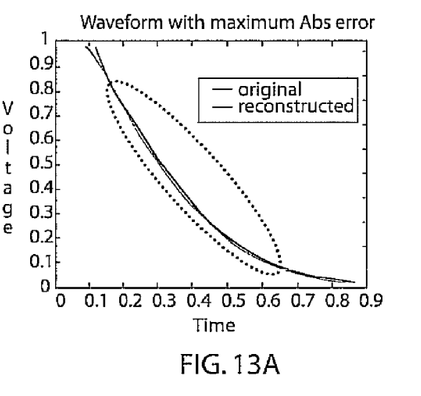
FIGS. 13A and 13B show an error histogram (FIG. 13B) for waveform compression for one dimensional linear parameterization for the area circled in FIG. 13A.
Figure 13B:
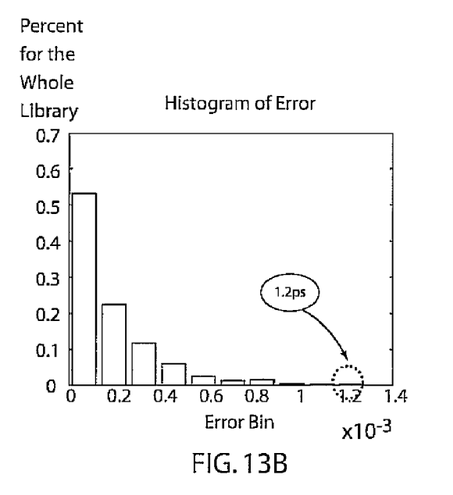

One Variable: We use the first order polynomial to model $f_i$ as a one-dimensional linear function of load capacitance. FIG. 13A shows the absolute error histogram and the worst reconstructed waveform with maximum $L^2$-norm error of 1.2 ps (the error without parameterization is 0.3 ps). Note that using a one-dimensional second order polynomial function yields maximum $L^2$-norm error of 1.15 ps.

Figure 14A:
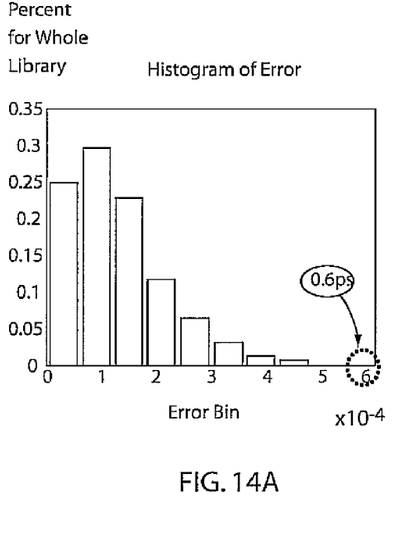
FIGS. 14A and 14B are error histograms showing piecewise linear coefficient modeling (FIG. 14A) and bilinear coefficient modeling (FIG. 14B)
Figure 14B:
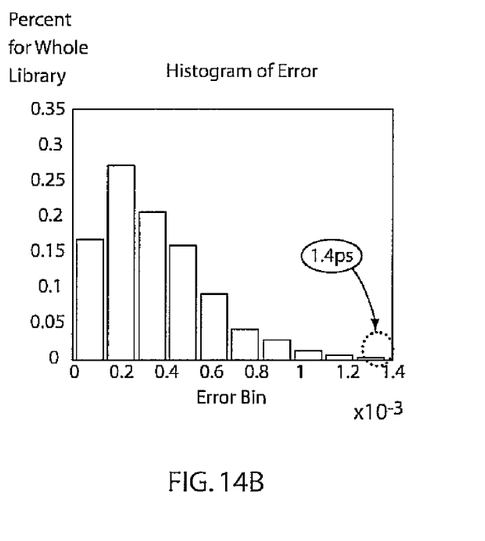

Multi Variable: We divide the C-S plane to shown in FIG. 9 to 4×4 equal regions and then model the principal coefficients of each gate by using a linear surface (piecewise linear). As shown in FIG. 14A, the maximum $L^2$-norm error is 0.6 ps with 93% compression. A bilinear model for principal coefficients of voltage waveform (c.f. FIG. 14B) returns a larger compression ratio of 98% with the maximum error of 1.4 ps.

A linear-algebra-based compression, PCA, was utilized to reduce the size of the CSM libraries. The technique was applied to several 65 nm, ECSM and CCS libraries. The simulation results proved the high accuracy and large compression ratio of the present techniques. Moreover, a parametric-compression is included which results in further compression and an analytical interpolation model for waveform computation. The PCA-based parameterized model may consider voltage, temperature, and process-related sources of variations.

Figure 15:
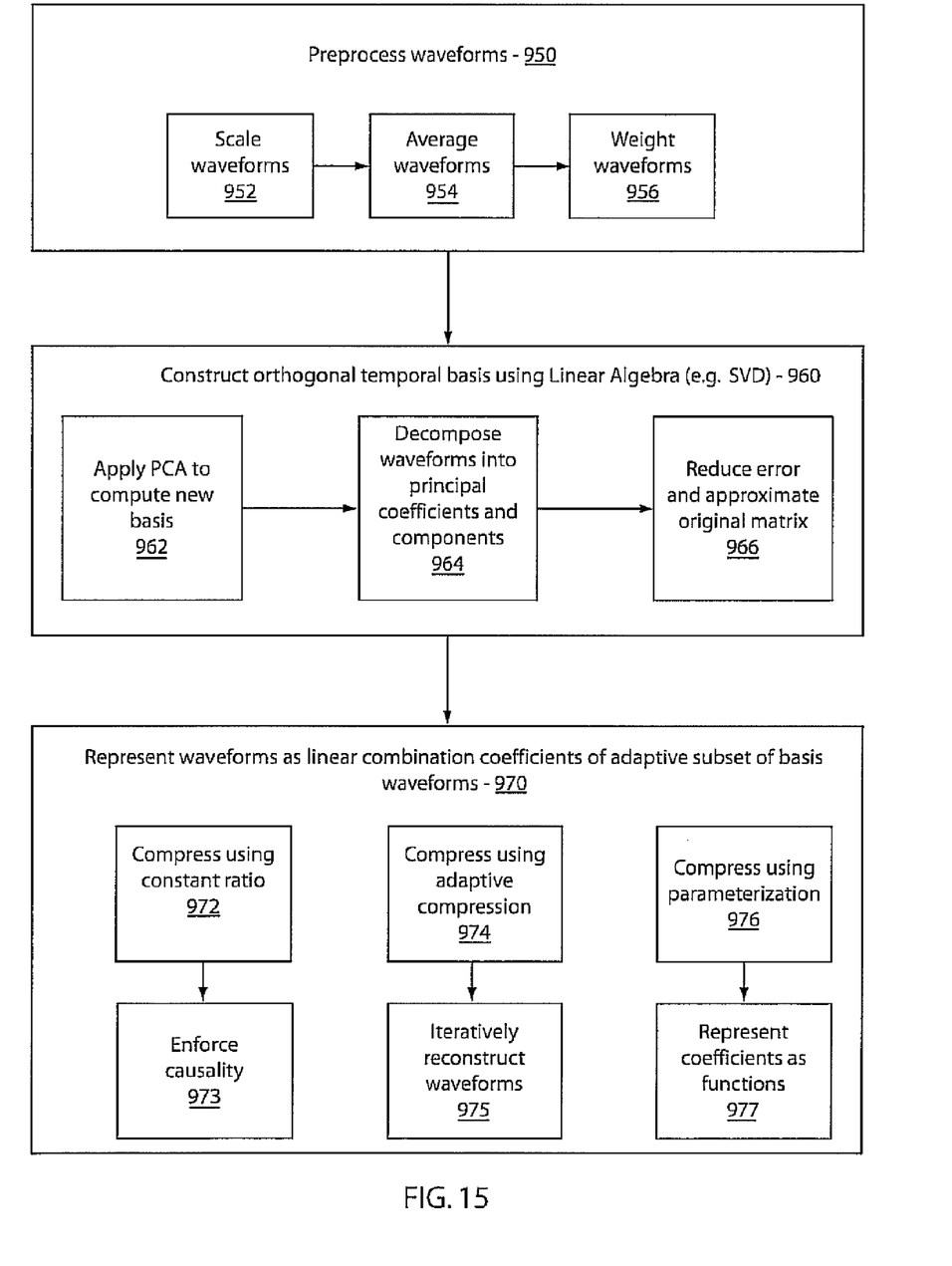
FIG. 15 is a block/flow diagram showing a system/method for waveform compression in accordance with an illustrative embodiment.

Referring to FIG. 15, a method for waveform compression included preprocessing a collection of waveforms representing cell response waveforms in block 950.

The preprocessing includes scaling the collection of waveforms relative to a threshold value in block 952. In one embodiment, scaling the collection of waveforms includes scaling the waveforms to align crossings on 10% and 90% of the threshold value using an affine transform. The preprocessing includes averaging the collection of waveforms in block 954. In one embodiment, averaging the collection of waveforms includes centering entries in the collection in a direction of time vectors (data-wise) about a zero position by introducing $0^{th}$ basis vectors.

The preprocessing includes weighting the collection of waveforms in block 956. In one embodiment, weighting the collection of waveforms includes weighting the collection of waveforms in accordance with regions of interest in each waveform.

In block 960, an orthogonal temporal waveform basis is constructed using linear algebra, e.g., single value decomposition (SVD), to create basis waveforms. In one embodiment, constructing the temporal waveform basis includes applying a principle component analysis (PCA) to compute a new basis for representing the collection of waveforms in an original matrix in block 962. In block 964, the waveforms are decomposed into principal coefficients and components by arranging singular values in decreasing order in the matrix. In block 966, singular values are set to zero below a threshold to reduce error and provide an approximation of the original matrix.

In block 970, the collection waveforms are represented as linear combination coefficients of an adaptive subset of the basis waveforms to compress an amount of stored information needed to reproduce the collection of waveforms. In one embodiment, representing the collection waveforms includes compressing the collection of waveforms using constant ratio compression in block 972. In block 973, causality for compressed waveforms is enforced.

Alternately, representing the collection waveforms includes compressing the collection of waveforms using adaptive compression in block 974. In block 975, waveforms are reconstructed until the waveforms are causal and include an error below an error threshold (iterative process).

In another embodiment, representing the collection waveforms includes compressing the collection of waveforms using parametric compression in block 976. In block 977, waveform coefficients are represented as analytic functions of variables.

Figure 16:
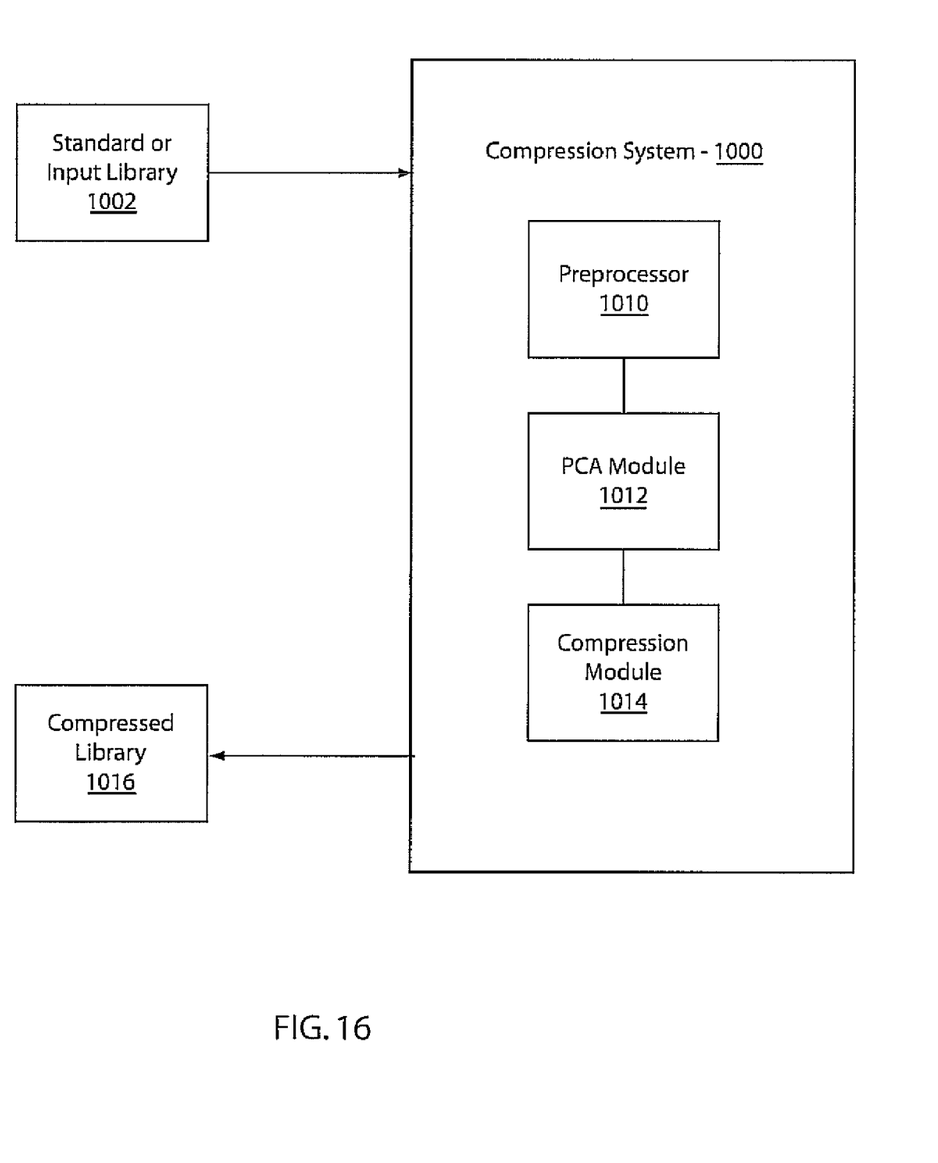
FIG. 16 is a block diagram showing a system for waveform compression in accordance with an illustrative embodiment.

Referring to FIG. 16, a system 1000 for compressing waveforms has an input collection 1002 of waveforms. The input waveforms may include a standard library of waveforms or any other collection of waveforms that needs to be compressed. The system 1000 includes a preprocessor 1010 configured to preprocess a collection of waveforms representing cell response waveforms. The preprocessing activity is described in greater detail above.

A principal component analysis (PCA) module 1012 is configured to construct an orthogonal temporal waveform basis using singular-valued decomposition to create basis waveforms. A compression module 1014 is configured to compress the collection waveforms by representing the collection of waveforms as linear combination coefficients of an adaptive subset of the basis waveforms to reduce an amount of stored information needed to reproduce the collection of waveforms. The compressed waveforms are output to a new compressed waveform library 1016.

Having described preferred embodiments of a system and method for efficient compression and handling of model library waveforms (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for waveform compression, comprising:
    preprocessing, using a processor and memory storage, a collection of waveforms representing cell and/or interconnect response waveforms;
    constructing a representative waveform basis using linear algebra to create basis waveforms for a set of waveforms; and
    representing the collection of waveforms as linear combination coefficients of an adaptive subset of the basis waveforms to compress an amount of stored information needed to reproduce the collection of waveforms.

2. The method as recited in claim 1, wherein preprocessing includes:
    shifting and scaling the collection of waveforms relative to a threshold value;
    averaging the collection of waveforms; and
    weighting the collection of waveforms.

3. The method as recited in claim 2, wherein scaling and shifting the collection of waveforms includes scaling and shifting the waveforms to align crossings on 10% and 90% of the threshold value.

4. The method as recited in claim 2, wherein averaging the collection of waveforms includes centering entries in the collection in a direction of time vectors (data-wise) about a zero position, the vector of averages representing a 0th basis vector.

5. The method as recited in claim 2, wherein weighting the collection of waveforms includes weighting the collection of waveforms in accordance with regions of interest in each waveform.

6. The method as recited in claim 1, wherein constructing includes:
    applying a principle component analysis (PCA) to compute a new basis for representing the collection of waveforms in an original matrix;
    decomposing the waveforms into principal components by arranging singular values in decreasing order in the matrix; and
    setting singular values below a threshold to zero to reduce error and provide an approximation of the original matrix.

7. The method as recited in claim 1, wherein representing the collection of waveforms includes compressing the collection of waveforms using constant ratio compression.

8. The method as recited in claim 7, further comprising enforcing causality for compressed waveforms.

9. The method as recited in claim 1, wherein representing the collection of waveforms includes compressing the collection of waveforms using adaptive compression.

10. The method as recited in claim 9, further comprising reconstructing waveforms until the waveforms are causal and include an error below an error threshold.

11. The method as recited in claim 1, wherein representing the collection of waveforms includes compressing the collection of waveforms using parametric compression.

12. The method as recited in claim 11, further comprising representing waveform coefficient as analytic functions of variables.

13. A computer readable memory medium comprising a computer readable program for waveform compression, wherein the computer readable program when executed on a computer causes the computer to perform the steps of:
    preprocessing, using a processor, a collection of waveforms representing cell and/or interconnect response waveforms;

constructing a representative waveform basis using linear algebra to create basis waveforms for a set of waveforms; and representing the collection of waveforms as linear combination coefficients of an adaptive subset of the basis waveforms to compress an amount of stored information needed to reproduce the collection of waveforms.

14. The computer readable medium as recited in claim 13, wherein preprocessing includes:

shifting and scaling the collection of waveforms relative to a threshold value;

averaging the collection of waveforms; and weighting the collection of waveforms.

15. The computer readable medium as recited in claim 14, wherein scaling and shifting the collection of waveforms includes scaling and shifting the waveforms to align crossings on 10% and 90% of the threshold value.

16. The computer readable medium as recited in claim 14, wherein averaging the collection of waveforms includes centering entries in the collection in a direction of time vectors (data-wise) about a zero position, the vector of averages representing a 0th basis vector.

17. The computer readable medium as recited in claim 14, wherein weighting the collection of waveforms includes weighting the collection of waveforms in accordance with regions of interest in each waveform.

18. The computer readable medium as recited in claim 13, wherein constructing includes:

applying a principle component analysis (PCA) to compute a new basis for representing the collection of waveforms in an original matrix;

decomposing the waveforms into principal components by arranging singular values in decreasing order in the matrix; and setting singular values below a threshold to zero to reduce error and provide an approximation of the original matrix.

19. The computer readable medium as recited in claim 13, wherein representing the collection of waveforms includes compressing the collection of waveforms using constant ratio compression.

20. The computer readable medium as recited in claim 19, further comprising enforcing causality for compressed waveforms.

21. The computer readable medium as recited in claim 13, wherein representing the collection of waveforms includes compressing the collection of waveforms using adaptive compression.

22. The computer readable medium as recited in claim 21, further comprising reconstructing waveforms until the waveforms are causal and include an error below an error threshold.

23. The computer readable medium as recited in claim 13, wherein representing the collection of waveforms includes compressing the collection of waveforms using parametric compression.

24. The computer readable medium as recited in claim 23, further comprising representing waveform coefficient as analytic functions of variables.

25. A system for compressing waveforms, comprising:

a preprocessor configured to preprocess a collection of waveforms representing cell response waveforms;

a principal component analysis (PCA) module configured to construct a representative waveform basis using linear algebra to create basis waveforms for a set of waveforms; and a compression module configured to compress the collection of waveforms by representing the collection of waveforms as linear combination coefficients of an adaptive subset of the basis waveforms to reduce an amount of stored information needed to reproduce the collection of waveforms.

* * * * *